US010809837B2

(12) United States Patent
Tada et al.

(10) Patent No.: US 10,809,837 B2
(45) Date of Patent: Oct. 20, 2020

(54) DISPLAY DEVICE WITH BUILT-IN TOUCH SENSOR

(71) Applicant: Japan Display Inc., Minato-ku (JP)

(72) Inventors: Yusuke Tada, Minato-ku (JP); Hajime Akimoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/535,606

(22) Filed: Aug. 8, 2019

(65) Prior Publication Data

US 2019/0369788 A1    Dec. 5, 2019

Related U.S. Application Data

(63) Continuation of application No. PCT/JP2017/041841, filed on Nov. 21, 2017.

(30) Foreign Application Priority Data

Feb. 8, 2017   (JP) ................... 2017-021187

(51) Int. Cl.
    *G06F 3/041*    (2006.01)
    *H01L 27/32*    (2006.01)
    *H01L 51/52*    (2006.01)

(52) U.S. Cl.
    CPC .......... *G06F 3/0412* (2013.01); *H01L 27/323* (2013.01); *H01L 27/3246* (2013.01);
    (Continued)

(58) Field of Classification Search
    CPC ...... G06F 3/041; G06F 3/0412; G06F 3/0446; G06F 2203/04103; H01L 27/3276;
    (Continued)

(56) References Cited

U.S. PATENT DOCUMENTS 10,003,045 B2 *   6/2018   Suzuki ............... H01L 51/5259
2008/0252839 A1   10/2008  Nakadaira
(Continued)

FOREIGN PATENT DOCUMENTS

JP        2015-050245 A    3/2015
KR   10-2008-0092848 A    10/2008
(Continued)

OTHER PUBLICATIONS

International Search Report dated Jan. 9, 2018 in PCT/JP2017/041841 filed on Nov. 21, 2017.
(Continued)

*Primary Examiner* — Vinh T Lam
(74) *Attorney, Agent, or Firm* — Oblon, McClelland, Maier & Neustadt, L.L.P.

(57) ABSTRACT

A display device with touch sensor according to an embodiment of the present invention includes: a plurality of first electrodes arranged in a display region on a sealing film, in which the first electrodes are connected via a first connection line; a plurality of second electrodes arranged in the same layer as, or in a layer different from the first electrodes, in which the second electrodes are connected via a second connection line intersecting with the first connection line in a plan view; an interlayer insulating film intervening between the first connection line and the second connection line and filling a dividing groove covered by the sealing film by which an organic insulating film is divided outside the display region; and a lead wiring line connected to the first electrode or the second electrode and passing over a portion of the interlayer insulating film that fills the dividing groove.

11 Claims, 11 Drawing Sheets (52) U.S. Cl.
CPC ...... *H01L 27/3258* (2013.01); *H01L 27/3276* (2013.01); *H01L 51/5253* (2013.01)

(58) Field of Classification Search
CPC ............... H01L 27/3246; H01L 27/323; H01L 27/3258; H01L 51/5253; G09F 9/00; G09F 9/30; H05B 33/02; H05B 33/12
See application file for complete search history.

(56) References Cited

U.S. PATENT DOCUMENTS

| | | |
|---|---|---|
| 2009/0309103 A1 | 12/2009 | Yagi |
| 2015/0060817 A1 | 3/2015 | Sato et al. |
| 2016/0013218 A1 | 1/2016 | Akiyoshi |
| 2016/0163777 A1* | 6/2016 | Ozawa ................ H01L 27/3276 257/40 |
| 2016/0285042 A1* | 9/2016 | Choi ................... H01L 51/5246 |
| 2017/0194599 A1* | 7/2017 | Furuie ................. H01L 51/5012 |
| 2017/0222180 A1 | 8/2017 | Sato et al. |
| 2017/0237024 A1* | 8/2017 | Kanaya ............... H01L 51/0097 257/40 |
| 2019/0006618 A1* | 1/2019 | Sonoda ................ H01L 51/5246 |
| 2019/0109296 A1 | 4/2019 | Sato et al. |

FOREIGN PATENT DOCUMENTS

| | | |
|---|---|---|
| KR | 10-2009-0131245 A | 12/2009 |
| KR | 10-2014-0079722 A | 6/2014 |

OTHER PUBLICATIONS

Office Action dated Jul. 25, 2020 in corresponding Korean Application No. 10-2019-7023097, along with a computer-generated English translation.

* cited by examiner

DISPLAY DEVICE WITH BUILT-IN TOUCH SENSOR

CROSS-REFERENCE TO RELATED APPLICATION

This present application is a continuation-in-part of International Application No. PCT/JP2017/041841, filed in the Japan Patent Office on Nov. 21, 2017, the entire content of which is hereby incorporated by reference. This application claims priority from Japanese application JP2017-021187 filed on Feb. 8, 2017, the entire content of which is hereby incorporated by reference.

BACKGROUND OF THE INVENTION

1. Field of the Invention

The present invention relates to a display device with touch sensor.

2. Description of the Related Art

JP2015-050245A discloses a display device built into a capacitive touch sensor. In the capacitive touch sensor, a first electrode in which adjacent main body portions are connected via a connection portion and which extends in the X-direction and a second electrode in which adjacent main body portions are connected via a connection portion and which extends in the Y-direction are disposed with a sealing film interposed between the first electrode and the second electrode.

For ensuring a process margin for a lead wiring line connected to the electrode of the capacitive touch sensor, the inventors of the present application are studying to provide, below the electrode, a planarization film covering an entire sealing film sealing the display device. In that case, however, an increase in the number of steps cannot be avoided, which involves the risk of causing an increase in cost.

SUMMARY OF THE INVENTION

It is an object of the invention to provide a display device with touch sensor capable of achieving both ensuring of a process margin for a lead wiring line and a reduction in cost.

1. A display device with touch sensor according to an embodiment of the present invention includes: a display region provided with a plurality of pixels including a light-emitting element; one or a plurality of organic insulating films formed of an organic insulating material, the organic insulating films being formed with a dividing groove by which each of the organic insulating films is divided outside the display region; a sealing film covering the light-emitting element, the organic insulating films, and the dividing groove and formed of an inorganic insulating material; a plurality of first electrodes arranged in the display region on the sealing film, in which the first electrodes that are adjacent in a first direction are connected via a first connection line and the first electrodes that are adjacent in a second direction intersecting with the first direction are not connected; a plurality of second electrodes arranged in the same layer as, or in a layer different from, the first electrode and each surrounded by the first electrodes in a plan view, in which the second electrodes that are adjacent in the second direction are connected via a second connection line intersecting with the first connection line in a plan view and the second electrodes that are adjacent in the first direction are not connected; an interlayer insulating film intervening between the first connection line and the second connection line and filling the dividing groove covered by the sealing film; and a lead wiring line connected to the first electrode or the second electrode and passing over a portion of the interlayer insulating film that fills the dividing groove.

DETAILED DESCRIPTION OF THE INVENTION

Hereinafter, embodiments of the invention will be described with reference to the drawings. The disclosure is illustrative only. Appropriate modifications that will readily occur to those skilled in the art and fall within the spirit of the invention are of course included in the scope of the invention. In the drawings, for more clarity of description, the width, thickness, shape, and the like of each part may be schematically represented compared to those in embodiments. However, they are illustrative only, and do not limit the interpretation of the invention. Moreover, in the specification and the drawings, elements similar to those described in relation to a previous drawing are denoted by the same reference numerals and signs, and a detailed description may be appropriately omitted.

Figure 1:
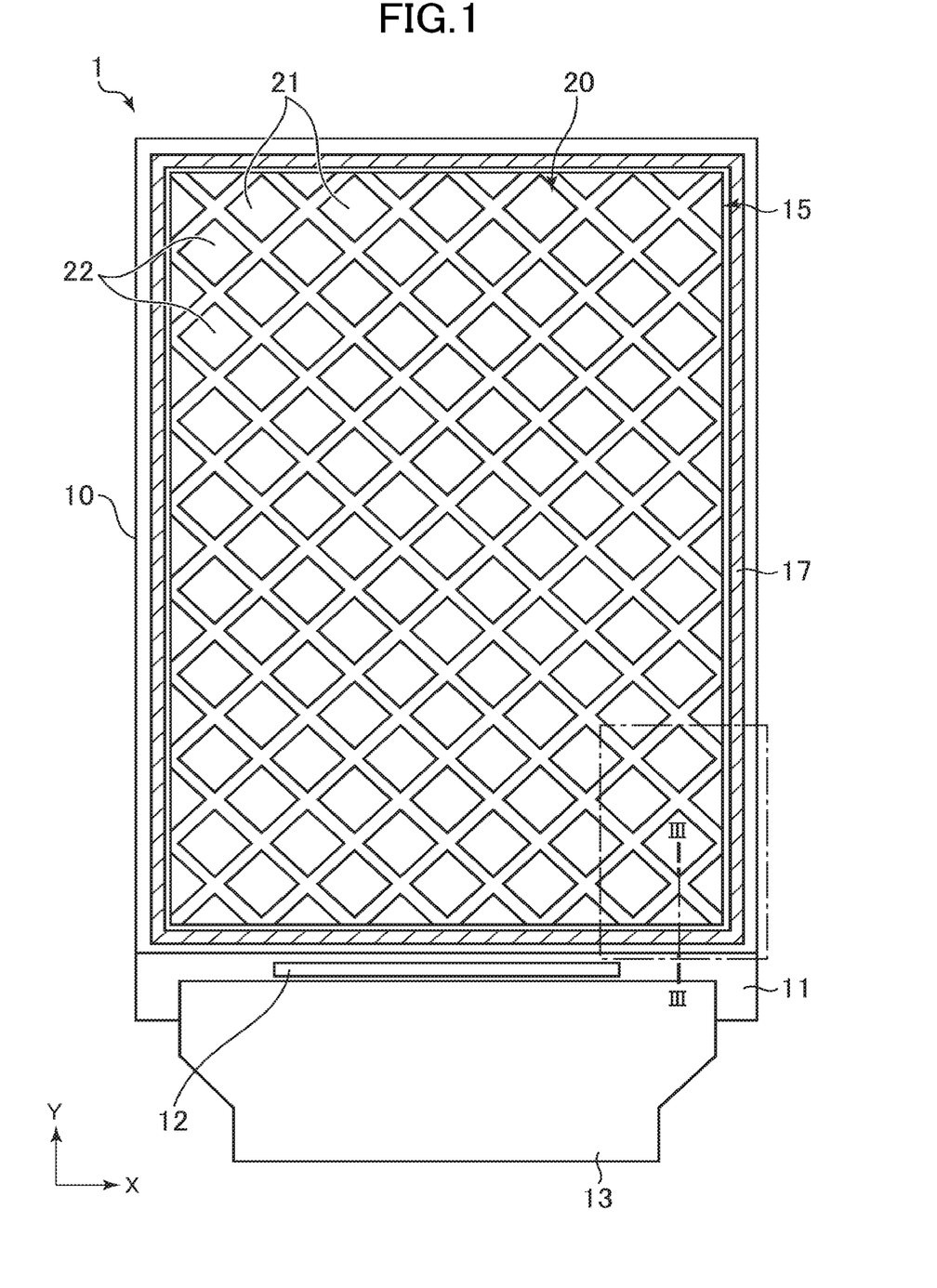
FIG. 1 is a plan view of a di device with touch sensor according to an embodiment.
Figure 2:
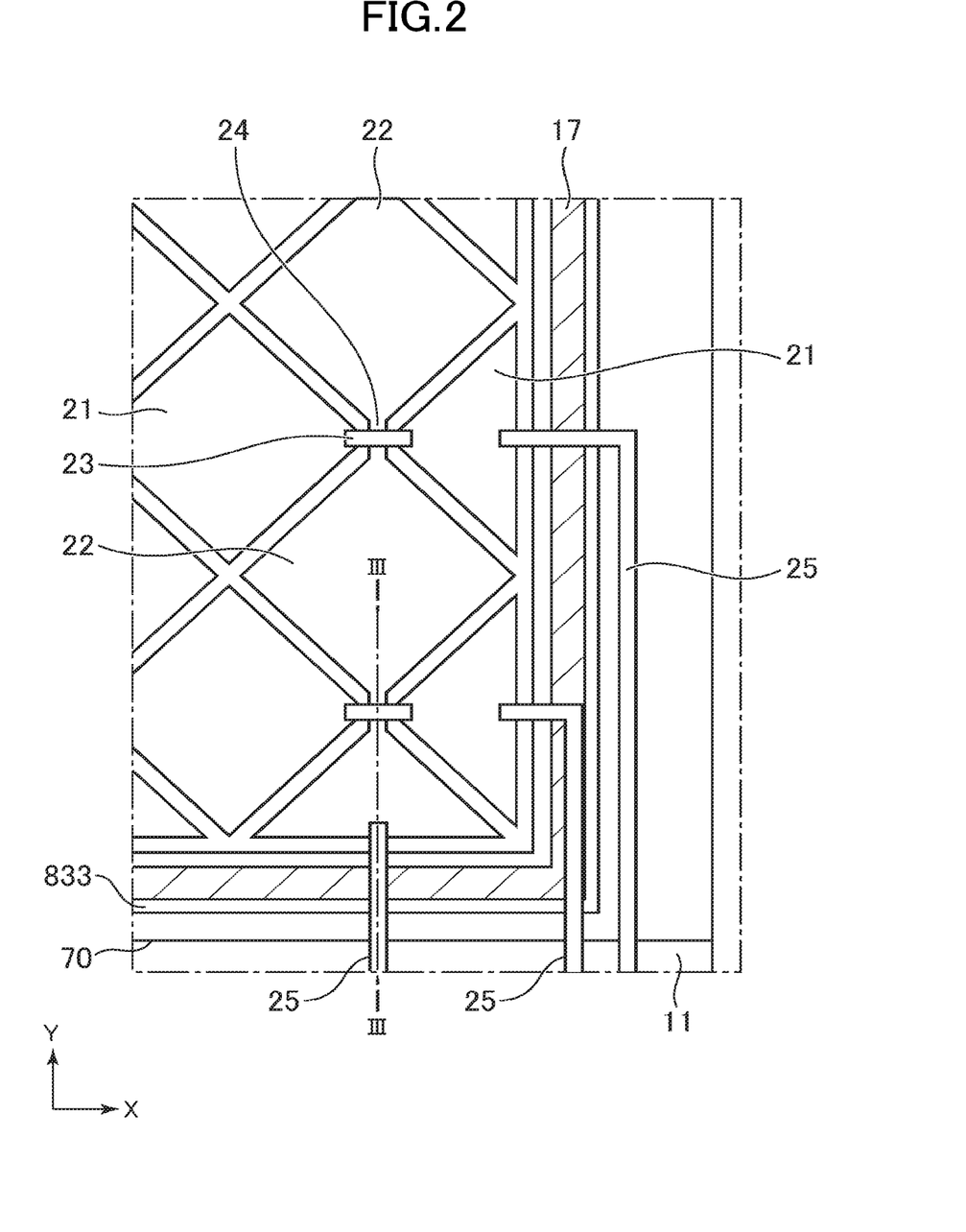
FIG. 2 is an enlarged view of a main portion of FIG. 1.

FIG. 1 is a plan view of a display device with touch sensor (hereinafter also referred to simply as "display device") according to an embodiment. FIG. 2 is an enlarged view of the portion within the dot-and-dash line frame shown in FIG. 1. As an example of the display device, an organic EL display device is mentioned. A display device 1 is configured such that unit pixels (sub-pixels) of multiple colors including, for example, red, green, and blue are combined to form a full-color pixel, thereby displaying a full-color image.

The display device 1 includes a display panel 10 and a touch sensor 20 formed on a display region 15 of the display panel 10. A peripheral region (frame region) 11 is formed outside the display region 15 of the display panel 10. An integrated circuit chip 12 for driving pixels is mounted in the peripheral region 11, and a flexible printed circuit board (FPC) 13 for electrical connection with the outside is connected to the peripheral region 11. In the following description, a direction along the side of the peripheral region 11, to which the FPC 13 is connected, is defined as "X-direction", and a direction orthogonal to the X-direction is defined as "Y-direction".

A moisture blocking region 17 for suppressing the entry of moisture is provided outside the display region 15 of the display panel 10. In FIGS. 1 and 2, the moisture blocking region 17 is hatched. The moisture blocking region 17 is formed in a frame shape so as to surround the display region 15. The moisture blocking region 17 may be disconnected at some midpoint. One or more moisture blocking regions surrounding the moisture blocking region 17 may be further provided. In the moisture blocking region 17, an organic insulating film included in the display panel 10 is divided, and an organic material is not included. The details of the moisture blocking region 17 will be described later.

Figure 3:
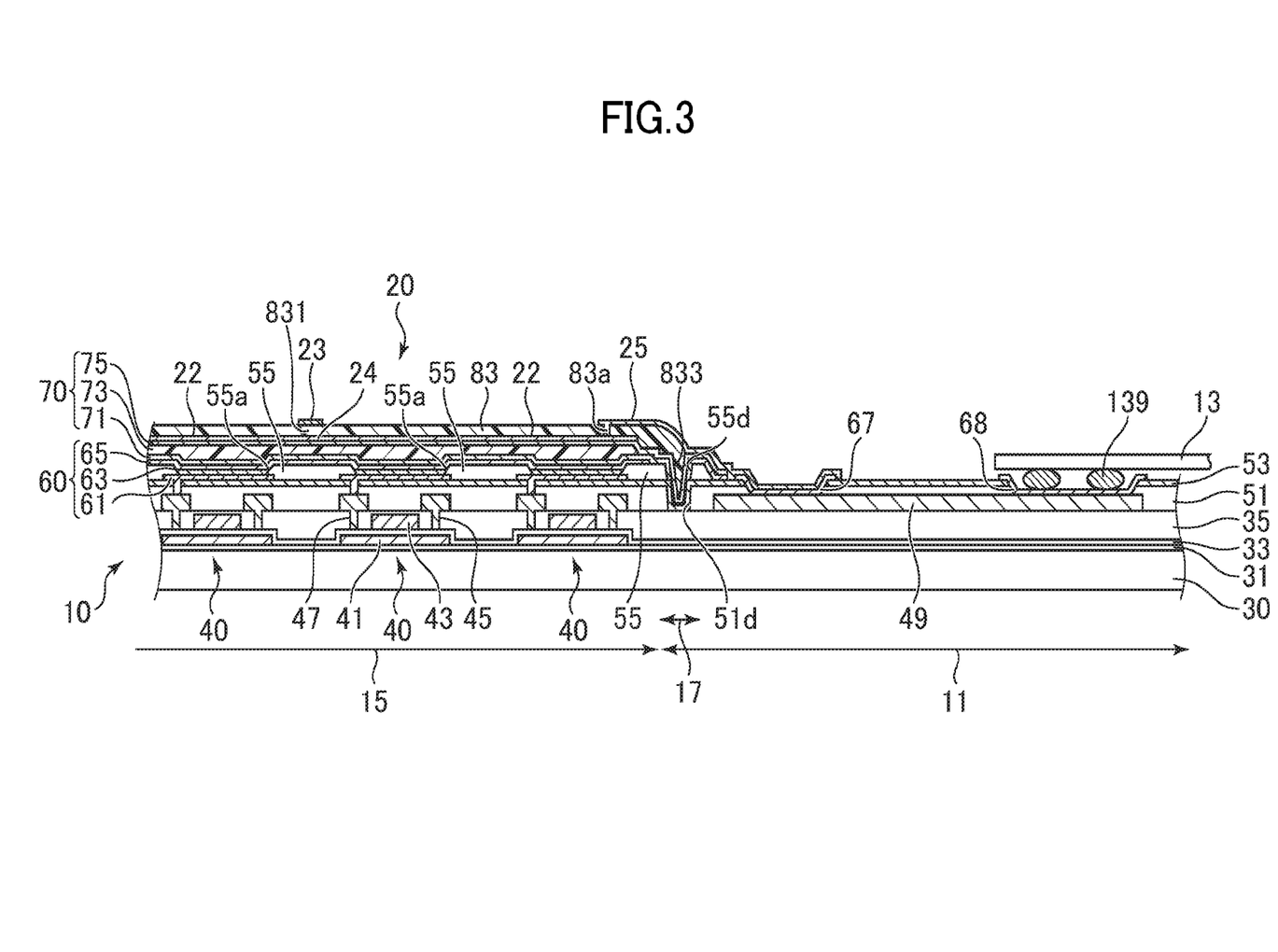
FIG. 3 is a cross-sectional view cut along line shown in FIG. 1.
Figure 4:
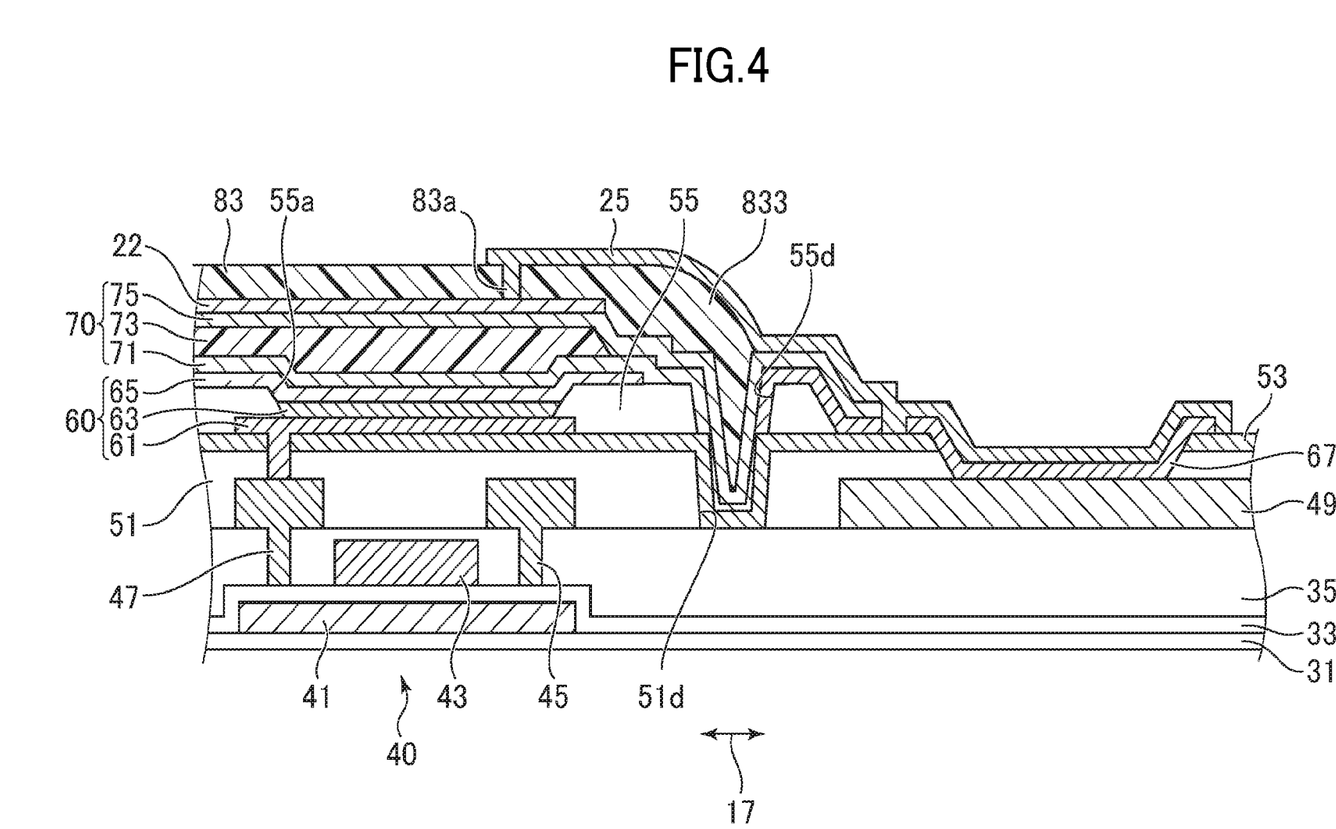
FIG. 4 is an enlarged view of a main portion of FIG. 3.

FIG. 3 is a cross-sectional view cut along line shown in FIG. 1. FIG. 4 is an enlarged view of the moisture blocking region 17 and its surroundings in FIG. 3. In these drawings, for clarity of cross-sectional structures, the hatchings of some layers such as a substrate 30, a planarization film 51, and a pixel separation film 55 are omitted. In the following description, the stacking direction is defined as "upper direction".

The substrate 30 is made of, for example, glass or a resin having flexibility such as polyimide. The substrate 30 is covered by an undercoat layer 31. A semiconductor layer 41 is formed on the undercoat layer 31. The semiconductor layer 41 is covered by a gate insulating film 33. A gate electrode 43 is formed on the gate insulating film 33. The gate electrode 43 is covered by a passivation film 35. A drain electrode 45 and a source electrode 47 penetrate the gate insulating film and the passivation film 35 to be connected to the semiconductor layer 41. The semiconductor layer 41, the gate electrode 43, the drain electrode 45, and the source electrode constitute a thin film transistor 40. The thin film transistor 40 is provided so as to correspond to each of a plurality of unit pixels. The undercoat layer 31, the gate insulating film 33, and the passivation film 35 are formed of an inorganic insulating material such as, for example, $SiO_2$ or SiN.

On the passivation film 35, in addition to the drain electrode 45 and the source electrode 47, a lead wiring line 49 is formed in the peripheral region 11. The lead wiring line shown in the drawing is a wiring line for electrically connecting the touch sensor 20 to the FPC 13. The drain electrode 45, the source electrode 47, and the lead wiring line 49 are covered by the planarization film 51. The planarization film 51 is covered by an interlayer insulating film 53. The drain electrode 45, the source electrode 47, and the lead wiring line 49 are formed of a conductive material including, for example, Al, Ag, Cu, Ni, Ti, and Mo. The planarization film 51 is formed of an organic insulating material such as, for example, an acrylic resin, and includes a flat upper surface. The interlayer insulating film 53 is formed of an inorganic insulating material such as, for example, $SiO_2$ or SiN.

The planarization film 51 is one example of an under insulating film, and covers the display region 15 and the peripheral region 11. The planarization film 51 is divided in the moisture blocking region 17. That is, in the moisture blocking region 17, a dividing groove 51d by which the planarization film 51 is divided is formed. The interlayer insulating film 53 covers the inside of the dividing groove 51d of the planarization film 51.

Pixel electrodes 61 (e.g., anodes) are formed on the interlayer insulating film 53. The pixel electrode 61 penetrates the planarization film 51 and the interlayer insulating film 53 to be connected to the source electrode 47. The pixel electrodes 61 are individually provided so as to correspond respectively to the plurality of unit pixels. In the embodiment, the display panel 10 is of a top-emission type, and the pixel electrode 61 is formed as a reflecting electrode. Moreover, terminals 67 and 68 are formed in the peripheral region 11, and penetrate the planarization film 51 and the interlayer insulating film 53 to be connected respectively to both end portions of the lead wiring line 49. The pixel electrode 61 and the terminals 67 and 68 are formed of a conductive material including, for example, Al, Ag, Cu, Ni, Ti, and Mo.

The pixel electrode 61 is covered by the pixel separation film 55. The pixel separation film 55 is also called a rib or a bank. In the pixel separation film 55, an opening 55a where the pixel electrode 61 is exposed at the bottom is formed. An inner edge portion of the pixel separation film 55 that forms the opening 55a lies on the peripheral edge portion of the pixel electrode 61. The pixel separation film 55 has a forward tapered shape in which the width is narrowed from the bottom portion to the top in a cross-sectional view. The pixel separation film 55 is formed in the peripheral region 11 in the vicinity of a boundary between the peripheral region 11 and the display region 15, but is not formed in the other portion of the peripheral region 11. The pixel separation film 55 is formed of an organic insulating material such as, for example, an acrylic resin.

The pixel separation film 55 is divided at the moisture blocking region 17. That is, in the moisture blocking region 17, a dividing groove 55d by which the pixel separation film 55 is divided is formed. The dividing groove 55d of the pixel separation film 55 is formed so as to overlap the dividing groove 51d of the planarization film 51 in a plan view.

Light-emitting layers 63 are individually formed spaced from each other on the pixel electrodes 61 exposed at the bottom of the opening 55a of the pixel separation film 55. The light-emitting layers 63 emit light in multiple colors including, for example, red, green, and blue respectively corresponding to the plurality of unit pixels. Together with the light-emitting layer 63, at least one layer of a hole transport layer, a hole injection layer, an electron transport layer, and an electron injection layer may be formed. The light-emitting layers 63 are individually formed by evaporation using a mask. The light-emitting layer 63 may be formed by evaporation as a uniform film (so-called solid film) extending over the entire display region 15. In that case, the light-emitting layer 63 emits light in a single color, and the components of the respective multiple colors including, for example, red, green, and blue are extracted by color filters or color conversion layers. The formation of the light-emitting layer 63 is not limited to evaporation, and the light-emitting layer 63 may be formed by coating.

The light-emitting layer 63 and the pixel separation film 55 are covered by a counter electrode 65 (e.g., a cathode). The counter electrode 65 is formed as a uniform film (so-called solid film) extending over the entire display region 15. The light-emitting layer 63, and the pixel electrode 61 and the counter electrode 65, which interpose the light-emitting layer 63 therebetween, constitute a light-emitting element 60. The light-emitting layer 63 emits light with a current flowing between the pixel electrode 61 and the counter electrode 65. The counter electrode 65 is formed of a transparent conductive material such as, for example, ITO or IZO, or a metal thin film of MgAg or the like.

The pixel separation film 55 and the counter electrode 65 are covered and thus sealed by a sealing film (passivation film) 70, and are shielded from moisture. The sealing film 70 has a three-layer stacked structure including, for example, an inorganic film 71, an organic film 73, and an inorganic film 75 in this order from the bottom. The inorganic films 71 and 75 are formed of an inorganic insulating material such as, for example, $SiO_2$ or SiN. The organic film 73 is formed of an organic insulating material such as, for example, an acrylic resin, and planarizes the upper surface of the sealing film 70.

The outer edge of the organic film 73 of the sealing film 70 is located on the inner side than the moisture blocking region 17. The outer edges of the inorganic films 71 and 75 are located on the outer side than the moisture blocking region 17, further located on the outer side than the outer edge of the pixel separation film 55, and are in contact with the interlayer insulating film 53.

The inorganic films 71 and 75 cover the inside of the dividing grooves 51d and 55d of the planarization film 51 and the pixel separation film 55. Specifically, the inorganic films 71 and 75 cover the interlayer insulating film 53 covering the inside of the dividing groove 51d of the planarization film 51, and also cover the inside of the dividing groove 55d of the pixel separation film 55. With this configuration, below the sealing film 70, the film that includes an organic material does not straddle the moisture blocking region 17. In other words, the film that straddles the moisture blocking region 17 does not include an organic material.

The display device 1 includes the touch sensor 20 on the sealing film 70. A plurality of first electrodes 21 and a plurality of second electrodes 22, which are two-dimensionally arranged, are formed on the sealing film 70. The first electrode 21 and the second electrode 22 constitute a drive electrode and a detection electrode of a capacitive touch sensor. In the embodiment, the first electrode 21 and the second electrode 22 are covered by an interlayer insulating film 83. The interlayer insulating film 83 is formed of an organic insulating material such as, for example, an acrylic resin, or an inorganic insulating material such as $SiO_2$ or SiN. However, although described in detail later, the interlayer insulating film 83 needs to fill, for planarization, the dividing groove 51d formed in the moisture blocking region 17, and therefore, it is preferable to select a material suitable for that.

As shown in FIGS. 1 and 2, each of the first electrode 21 and the second electrode 22 is formed in a rectangular shape with the X-direction (first direction) and the Y-direction (second direction) intersecting therewith (e.g., orthogonal thereto) as diagonal directions, that is, a so-called rhombic shape (diamond shape). Moreover, each of the first electrode and the second electrode 22 is formed of a transparent conductive material such as, for example, ITO. The first electrode 21 and the second electrode 22 are not limited to this configuration, and the first electrode 21 and the second electrode 22 may be formed of net-like wiring lines (mesh wiring lines) made of a conductive material such as metal such that the conductive material does not overlap the light-emitting region of the light-emitting element 60 in a plan view.

The plurality of first electrodes 21 are two-dimensionally arranged side by side in each of the X-direction and the Y-direction. In the first electrodes 21, the first electrodes 21 that are adjacent in the X-direction are connected via a first connection line 23, and the first electrodes 21 that are adjacent in the Y-direction are not connected. That is, in the plurality of first electrodes 21, the first electrodes 21 that are adjacent in the X-direction are connected via the first connection line 23 to thereby form each of a plurality of electrode rows extending in the X-direction, and the electrode rows are electrically isolated in the Y-direction.

The plurality of second electrodes 22 are also two-dimensionally arranged side by side in each of the X-direction and the Y-direction. In the second electrodes 22, the second electrodes 22 that are adjacent in the Y-direction are connected via a second connection line 24 intersecting with the first connection line 23 in a plan view, and the second electrodes 22 that are adjacent in the X-direction are not connected. That is, in the plurality of second electrodes 22, the second electrodes 22 that are adjacent in the Y-direction are connected via the second connection line 24 to thereby form each of a plurality of electrode rows extending in the Y-direction, and the electrode rows are electrically isolated in the X-direction.

Each of the second electrodes 22 is disposed so as to be surrounded by the first electrodes 21 in a plan view. For example, each of the second electrodes 22 is disposed between the first electrodes 21 that are adjacent in a direction (e.g., a direction at 45 degrees or −45 degrees) intersecting with both the X-direction and the Y-direction, and is surrounded by four first electrodes 21. The first electrode 21 and the second electrode 22 are spaced apart so as not to be in contact with each other, and thus are electrically isolated.

In the embodiment, the plurality of first electrodes 21 and the plurality of second electrodes 22 are disposed in the same layer between the sealing film 70 and the interlayer insulating film 83. However, the plurality of first electrodes 21 and the plurality of second electrodes 22 are not limited to this configuration, and may be disposed in different layers. That is, one of the first electrode 21 and the second electrode 22 may be disposed below the interlayer insulating film 83, and the other may be disposed on the interlayer insulating film 83. Moreover, both the first electrode 21 and the second electrode 22 may be disposed on the interlayer insulating film 83.

The first connection line 23 and the second connection line 24 intersect with each other in a plan view. The interlayer insulating film 83 intervenes between the first connection line 23 and the second connection line 24, which intersect with each other in a plan view, and the first connection line 23 and the second connection line 24 are electrically isolated. Hereinafter, a portion of the interlayer insulating film 83 that intervenes between the first connection line 23 and the second connection line 24 is referred to as "intervening portion 831".

In the embodiment, the first connection line 23 is a so-called bridge wiring line that is disposed on the interlayer insulating film 83. The first connection line 23 is connected to the first electrode 21 through a through hole formed in the interlayer insulating film 83. The first connection line 23 is formed of a conductive material including, for example, Al, Ag, Cu, Ni, Ti, and Mo. On the other hand, the second connection line 24 is formed continuously with the second electrode 22 below the interlayer insulating film 83.

The first connection line 23 and the second connection line 24 are not limited to this configuration. The second connection line 24 may be disposed as a bridge wiring line on the interlayer insulating film 83, and the first connection line 23 may be formed continuously with the first electrode 21 below the interlayer insulating film 83. Moreover, an intersecting portion at which the first connection line 23 intersects, as a bridge wiring line, with the second connection line 24 and an intersecting portion at which the second connection line 24 intersects, as a bridge wiring line, with the first connection line 23 may coexist.

In the embodiment, the interlayer insulating film 83 fills the dividing grooves 51d and 55d covered by the inorganic films 71 and 75 of the sealing film 70. Hereinafter, a portion of the interlayer insulating film 83 that fills the dividing grooves 51d and 55d is referred to as "groove filling portion 833". The groove filling portion 833 fills the dividing grooves 51d and 55d as described above, and therefore, the upper surface of the groove filling portion 833 is more planarized than the upper surface of the dividing grooves 51*d* and 55*d* covered by the inorganic films 71 and 75.

Moreover, in the embodiment, the interlayer insulating film 83 is formed as a uniform film (so-called solid film) extending over the entire display region 15, and the intervening portion 831 intervening between the first connection line 23 and the second connection line 24 and the groove filling portion 833 filling the dividing grooves 51*d* and 55*d* are continuously formed. The upper surface of the interlayer insulating film 83 is gently inclined at the peripheral edge portion where the groove filling portion 833 is provided.

The groove filling portion 833 is formed so as to include the entire moisture blocking region 17. The outer edge of the interlayer insulating film 83 may be aligned with the outer edge of the moisture blocking region 17, or may be located on the outer side than the moisture blocking region 17 and on the inner side than the outer edge of the pixel separation film 55. Moreover, the groove filling portion 833 may be located on the outer side than the outer edge of the pixel separation film 55.

The touch sensor 20 includes a plurality of lead wiring lines 25 led from the peripheral edge portion of the display region 15 to the peripheral region 11. The lead wiring line 25 is formed of the same material as and simultaneously with the first connection line 23 on the interlayer insulating film 83. Each of the lead wiring lines 25 is connected to the first electrode 21 or the second electrode 22 through an opening 83*a* formed in the interlayer insulating film 83, and passes over the groove filling portion 833 provided at the peripheral edge portion of the interlayer insulating film 83.

As shown in FIG. 2, the lead wiring line 25 that is connected to the second electrode 22 extends in the Y-direction so as to cross the moisture blocking region 17. A portion of the lead wiring lines 25 that is connected to the first electrodes 21 extends in the X-direction so as to cross the moisture blocking region 17, and then bends from the X-direction to the Y-direction to extend in the Y-direction. Moreover, another portion of the lead wiring lines 25 that is connected to the first electrode 21 bends at the moisture blocking region 17 from the X-direction to the Y-direction and extends in the Y-direction.

The lead wiring line 25 passing over the groove filling portion 833 goes from the groove filling portion 833 onto the inorganic films 71 and 75 of the sealing film 70, and further extends on and from the inorganic films 71 and 75 to the outside thereof to straddle the outer edge of the inorganic films 71 and 75. The lead wiring line 25 extending to the outside of the inorganic films 71 and 75 is connected to the terminal 67 (first terminal), which is close to the display region 15, in the two terminals 67 and 68 connected to the lead wiring line 49 embedded in the peripheral region 11.

On the other hand, to the terminal 68 (second terminal) away from the display region 15, the FPC 13 is connected via anisotropically conductive members 139. Moreover, a not-shown terminal (third terminal) electrically connected to the light-emitting element 60 is also provided in the peripheral region 11, and the FPC 13 is also connected to the not-shown terminal via the anisotropically conductive members 139. The not-shown terminal is electrically connected to the light-emitting element 60 via, for example, the thin film transistor 40, the integrated circuit chip 12, and the like.

In the embodiment described above, the dividing grooves 51*d* and 55*d* covered by the inorganic films 71 and 75 are filled with a portion (the groove filling portion 833) of the interlayer insulating film 83, and the lead wiring line 25 is formed thereon. For this reason, compared to when the dividing grooves 51*d* and 55*d* are not filled with the groove filling portion 833, a process margin for the lead wiring line 25 can be ensured.

That is, when the dividing grooves 51*d* and 55*d* are not filled with the groove filling portion 833, the lead wiring line 25 needs to be formed so as to pass through the dividing grooves 51*d* and 55*d*. However, when the lead wiring line 25 is formed in the dividing grooves 51*d* and 55*d*, there is a risk that the lead wiring line 25 cannot be favorably formed due to the occurrence of a film residue. In contrast to this, in the embodiment, the dividing grooves 51*d* and 55*d* are filled with the groove filling portion 833, so that the upper surface of the groove filling portion 833 is more planarized than the dividing grooves 51*d* and 55*d*. Therefore, it is possible to ensure a process margin for the lead wiring line 25 and improve a process tolerance.

Moreover, in the embodiment, the dividing grooves 51*d* and 55*d* covered by the inorganic films 71 and 75 are filled using a portion (the groove filling portion 833) of the interlayer insulating film 83. For this reason, for example compared to when an insulating film for planarization is separately formed below the first and second electrodes 21 and 22, a reduction in cost can be realized, and further, external quantum efficiency can be improved.

That is, when the insulating film for planarization is separately formed, an increase in the number of steps cannot be avoided, which involves the risk of causing an increase in cost. In addition, there is a risk that external quantum efficiency is lowered because the transmittance is lowered due to the insulating film. In contrast to this, in the embodiment, the dividing grooves 51*d* and 55*d* are filled using the interlayer insulating film 83, and the insulating film for planarization is not separately formed. Therefore, it is possible to realize a reduction in cost and also improve external quantum efficiency.

Further, in the embodiment, the FPC 13 is connected to both the terminal 68 (second terminal) electrically connected to the touch sensor 20 and the not-shown terminal (third terminal) electrically connected to the light-emitting element 60. For this reason, signals can be supplied by one FPC 13 from the outside to both the touch sensor 20 and the light-emitting element 60.

Figure 5:
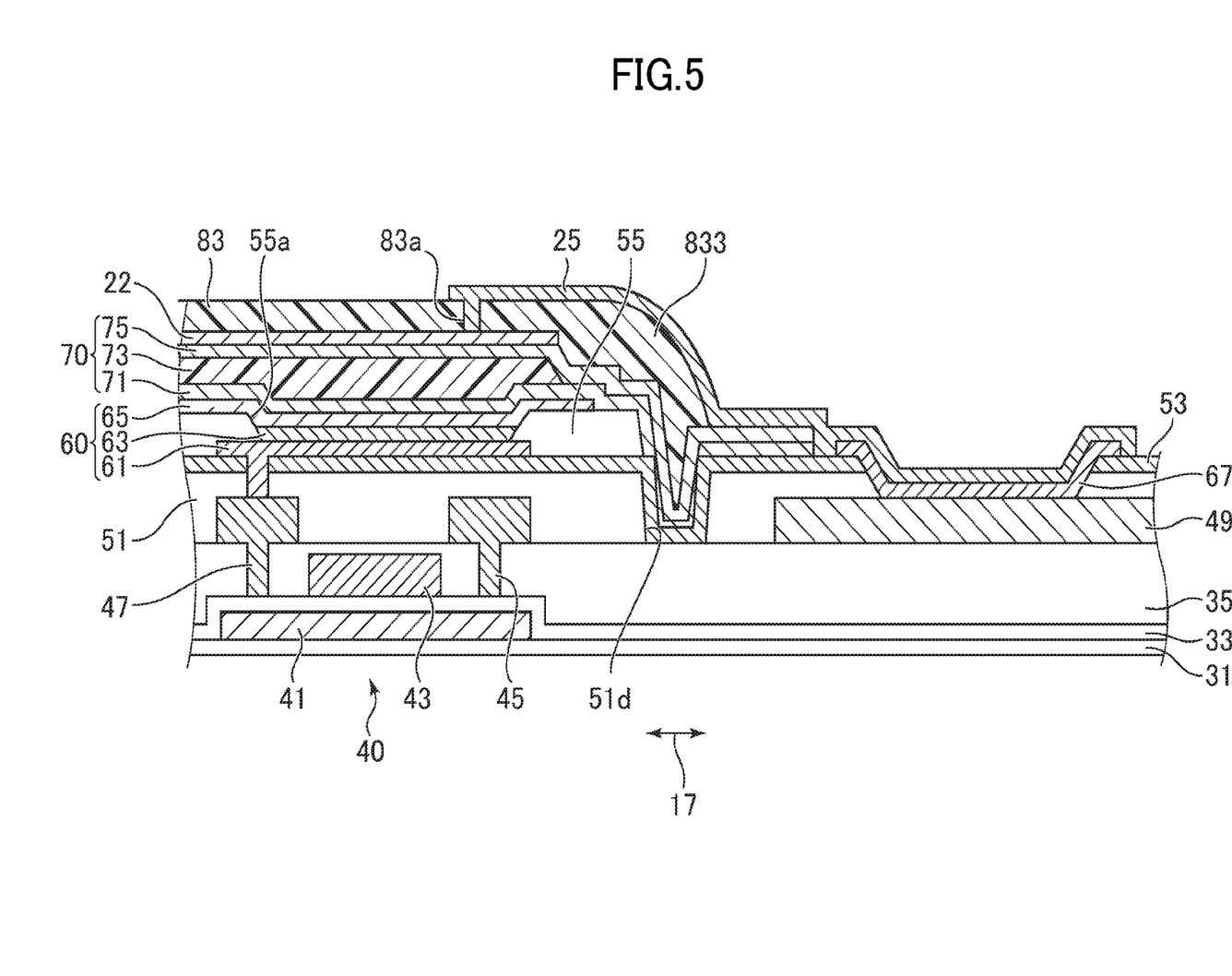
FIG. 5 is a diagram showing a modified example.

Although, in the embodiment, the dividing grooves 51*d* and 55*d* are formed in both the planarization film 51 and the pixel separation film 55 in the moisture blocking region 17, the dividing grooves 51*d* and 55*d* are not limited to this configuration. As shown in FIG. 5, by forming the pixel separation film 55 on the inner side than the moisture blocking region 17, the formation of the dividing groove 55*d* may be omitted. In this case, the dividing groove 51*d* is formed only in the planarization film 51 in the moisture blocking region 17, and the outer edge of the pixel separation film 55 is located on the inner side than the dividing groove 51*d* of the planarization film 51.

Figure 6:
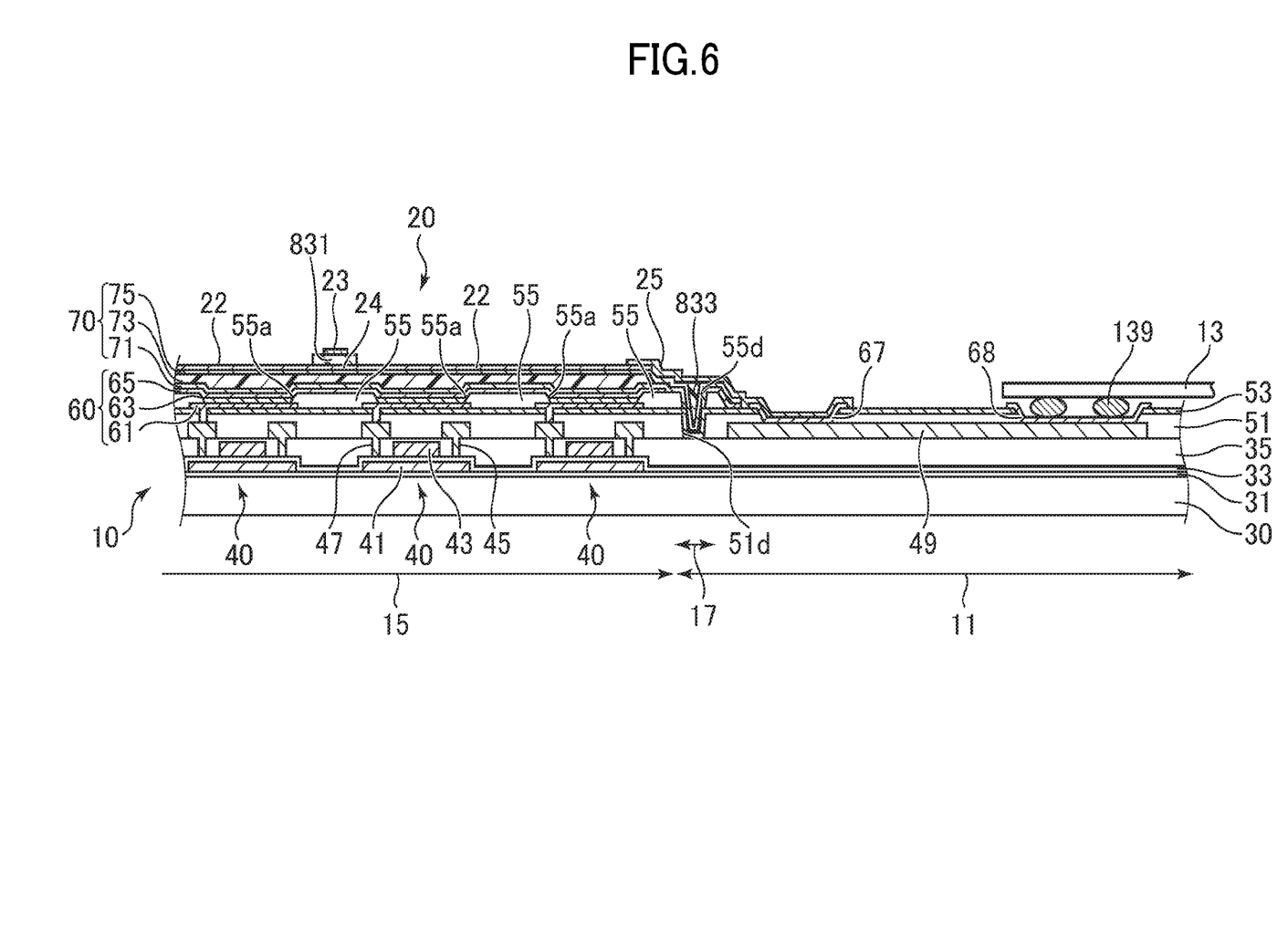
FIG. 6 is a cross-sectional view of a display device with touch sensor according to another embodiment.
Figure 7:
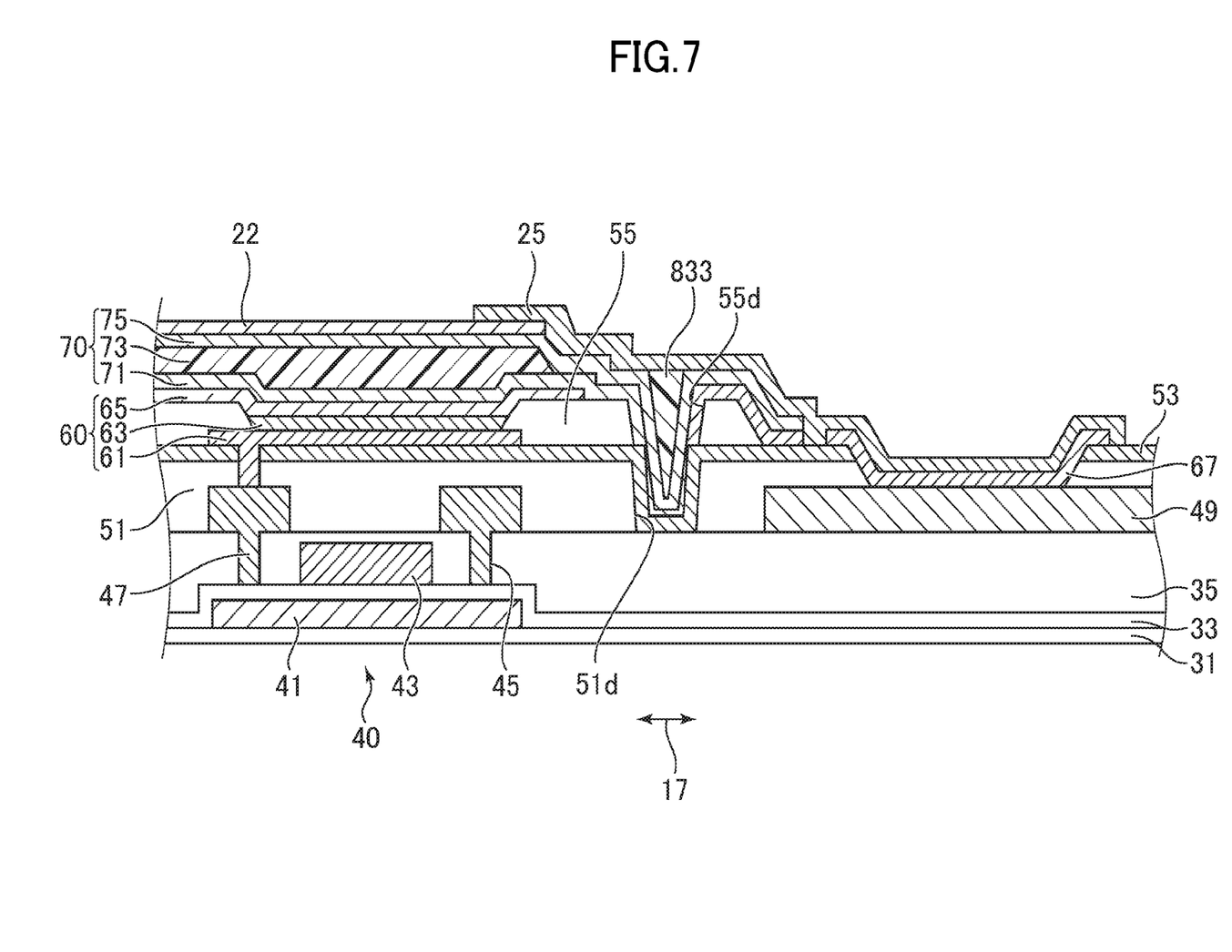
FIG. 7 is an enlarged view of a main portion of FIG. 6.

FIG. 6 is a cross-sectional view of a display device with touch sensor according to another embodiment. FIG. 7 is an enlarged view of the moisture blocking region 17 and its surroundings in FIG. 6. In the embodiment, the interlayer insulating film 83 is separately formed at each position at which the first connection line 23 and the second connection line 24 intersect with each other in a plan view, and does not cover the first electrode 21 and the second electrode 22. That is, the intervening portion 831 is separately formed at each position at which the first connection line 23 and the second connection line 24 intersect with each other in a plan view. Moreover, the intervening portion 831 and the groove filling portion 833 are also separately formed.

The groove filling portion 833 fills the dividing grooves 51d and 55d, and thus the upper surface of the groove filling portion 833 approaches the upper surface of the inorganic films and 75 around the dividing grooves 51d and 55d and is planarized as a whole. The upper surface of the groove filling portion 833 may be aligned with the upper surface of the inorganic films 71 and 75 around the dividing grooves 51d and 55d, or may be lower or higher than that. Moreover, the groove filling portion 833 may be formed only on the inside of the dividing grooves 51d and 55d, or may be formed so as to protrude to the outside of the dividing grooves 51d and 55d.

The lead wiring line 25 is formed mainly on the inorganic films 71 and 75, and passes over the groove filling portion 833 in the moisture blocking region 17. Specifically, the lead wiring line 25 goes from the first electrode 21 or the second electrode 22 onto the inorganic films 71 and 75, goes from the inorganic films 71 and 75 onto the groove filling portion 833, and goes from the groove filling portion 833 again onto the inorganic films 71 and 75. Then, the lead wiring line 25 extends on and from the inorganic films 71 and 75 to the outside thereof to straddle the outer edges of the inorganic films 71 and 75, and is connected to the terminal 67 (first terminal).

Also in the embodiment described above, a process margin for the lead wiring line 25 can be ensured, and a reduction in cost can be realized. Especially, the intervening portion 831 and the groove filling portion 833 of the interlayer insulating film 83 are separated, and the groove filling portion 833 is limitedly formed in the dividing grooves 51d and 55d, so that the planarity of the moisture blocking region 17 and its surroundings can be further increased. Moreover, the interlayer insulating film 83 does not cover the first electrode and the second electrode 22, so that external quantum efficiency can be further improved.

FIGS. 8 to 11 are diagrams showing exemplary manufacturing steps of the display device with touch sensor according to the embodiment.

Figure 8:
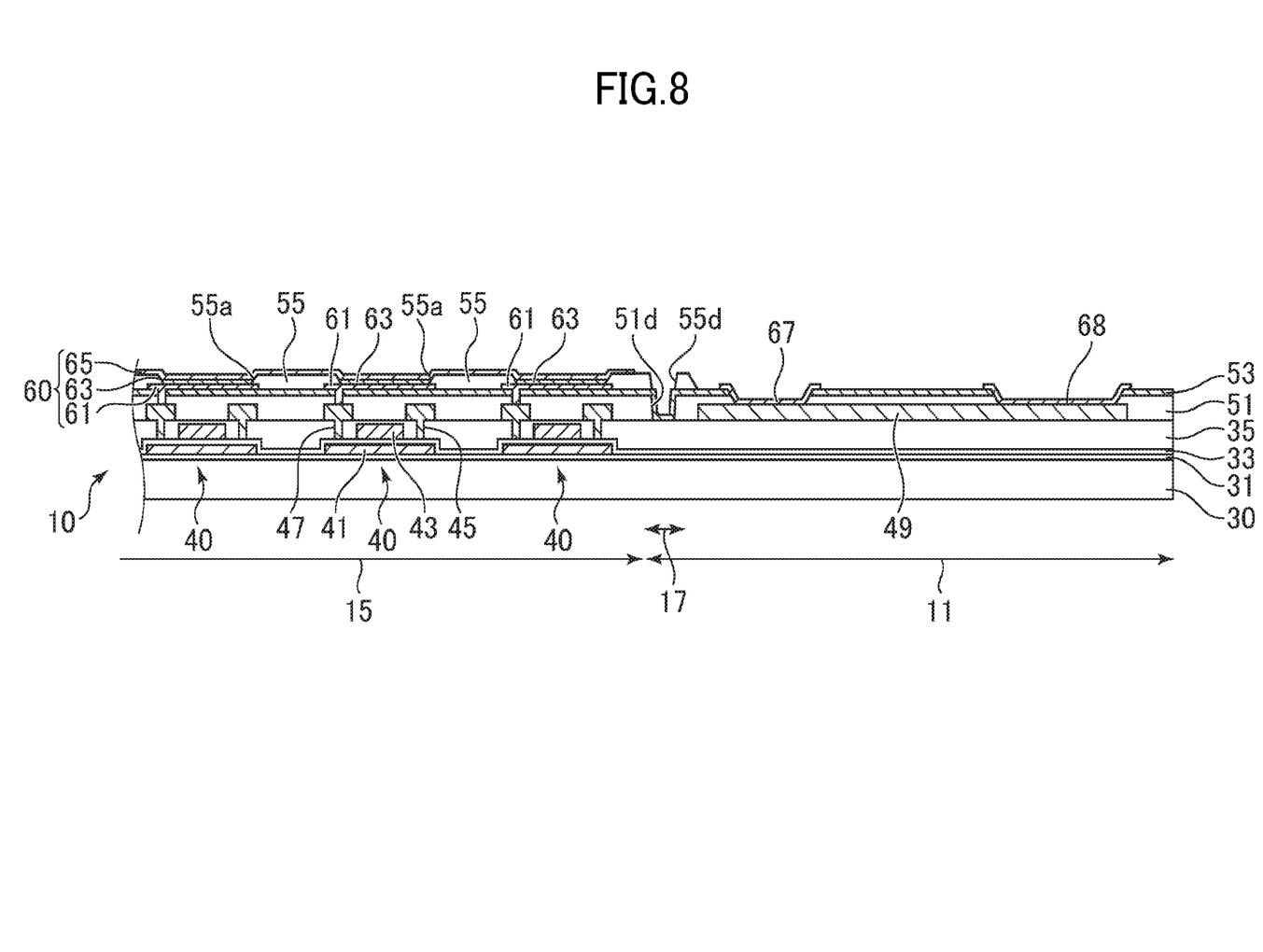
FIG. 8 is a diagram showing an exemplary manufacturing step of the display device with touch sensor according to the embodiment.

FIG. 8 shows a state where the light-emitting element 60 is completed. The dividing grooves 51d and 55d are formed in the moisture blocking region 17. Specifically, the dividing groove 51d is formed in the planarization film 51, and the inside of the dividing groove 51d is covered by the interlayer insulating film 53. The dividing groove 55d is formed in the pixel separation film 55 so as to overlap the dividing groove 51d of the planarization film 51. With this configuration, the dividing grooves 51d and 55d extending over the two layers of the planarization film 51 and the pixel separation film 55 are formed.

Figure 9:
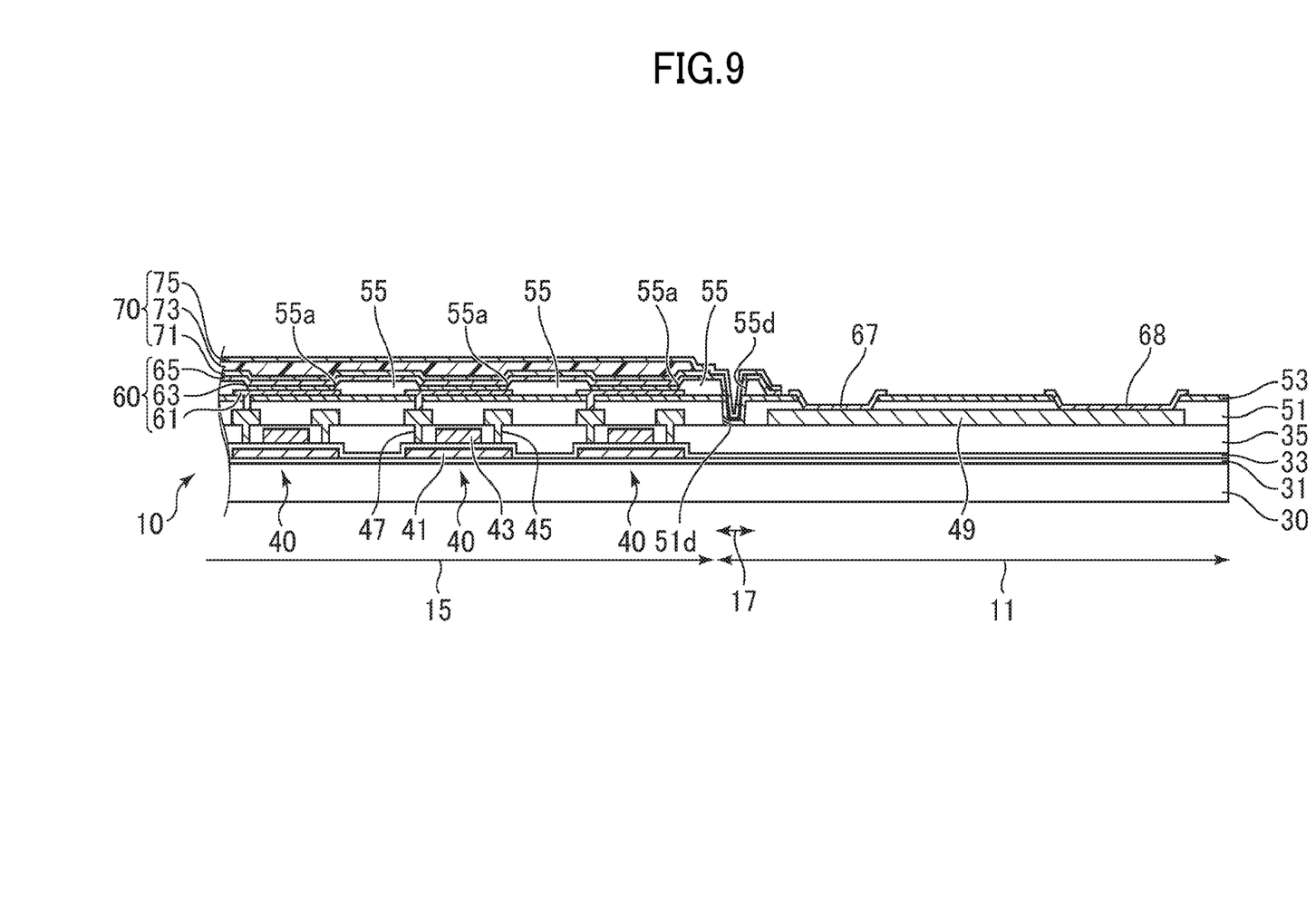
FIG. 9 is a diagram subsequent to FIG. 8.

FIG. 9 shows a step for forming the sealing film 70. The organic film 73 of the sealing film 70 is formed on the inner side than the moisture blocking region 17. The inorganic films 71 and 75 of the sealing film 70 extend to the outer side than the moisture blocking region 17, and further extend to the outer side than the outer edge of the pixel separation film 55 to be in contact with the interlayer insulating film 53. The inorganic films 71 and 75 cover the dividing grooves 51d and 55d formed in the moisture blocking region 17.

The inorganic films 71 and 75 are selectively grown by, for example, chemical vapor deposition (CVD) using a mask. Alternatively, the inorganic films 71 and 75 may be formed over the entire surface by, for example, CVD, and then selectively removed.

Figure 10:
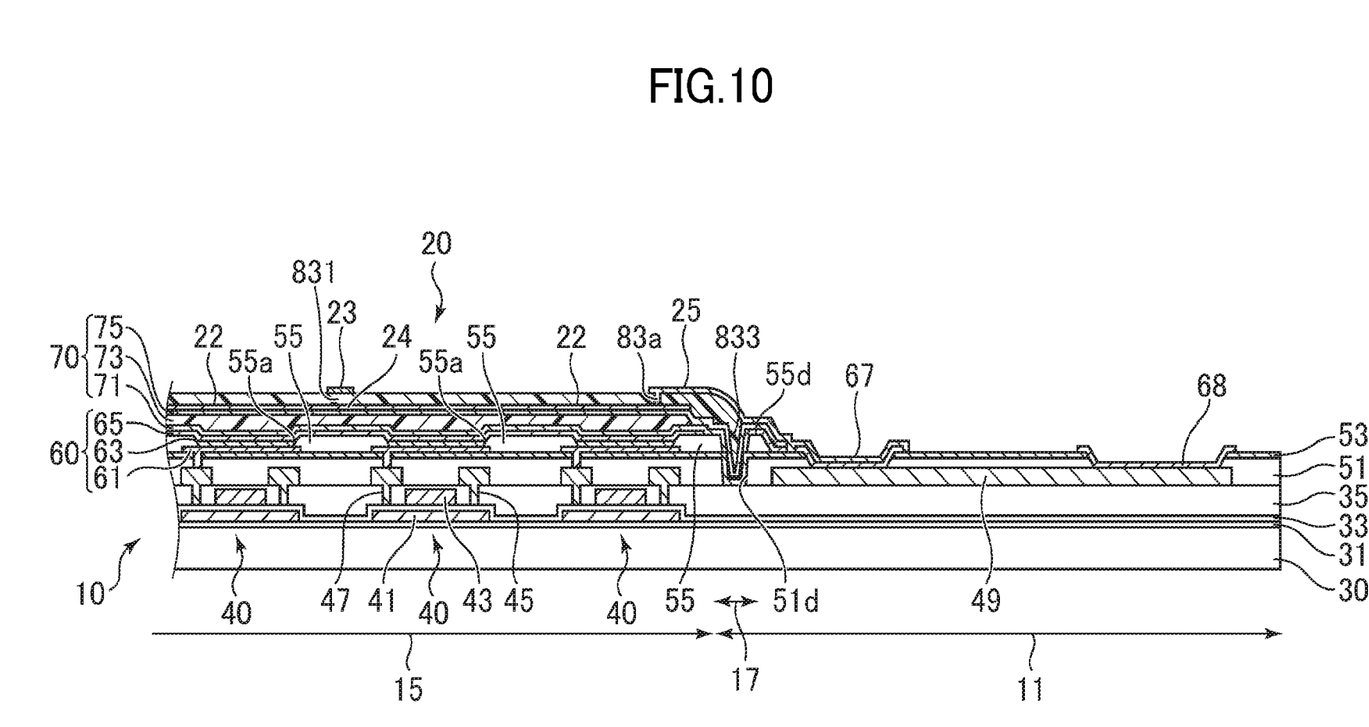
FIG. 10 is a diagram subsequent to FIG. 9.

FIG. 10 shows a step for forming the touch sensor 20. More specifically, on the sealing film 70, the first electrode 21, the second electrode 22, and the second connection line 24 are formed, the interlayer insulating film 83 is formed thereon, and the first connection line 23 and the lead wiring line 25 are formed on the interlayer insulating film 83. The dividing grooves 51d and 55d formed in the moisture blocking region 17 are filled with the groove filling portion 833 as a portion of the interlayer insulating film 83, and the lead wiring line 25 is formed so as to pass over the groove filling portion 833.

Figure 11:
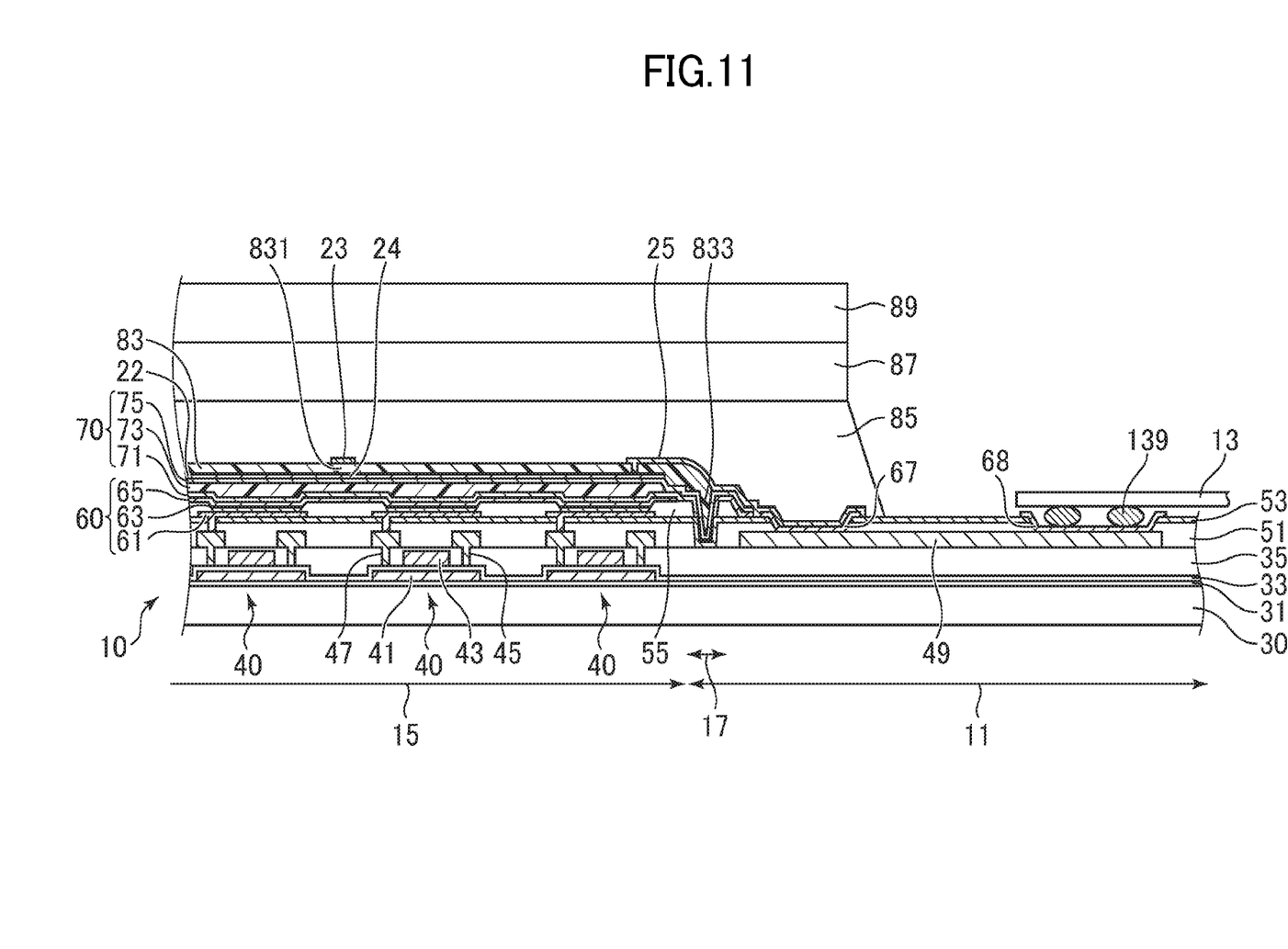
FIG. 11 is a diagram subsequent to FIG. 10.

FIG. 11 shows a step for forming a protective film 85 and the like covering the touch sensor 20. Herein, the protective film 85 is formed so as to cover the whole of the touch sensor 20 and further cover the lead wiring line 25 and the terminal 67. The protective film 85 is formed of an organic insulating material such as, for example, an acrylic resin. A circularly polarizing film 87 is disposed on the protective film 85, and a cover film 89 is disposed on the circularly polarizing film 87. Moreover, the FPC 13 is connected, via the anisotropically conductive members 139, to the terminal 68 not covered by the protective film 85.

Although, in the embodiments described above, the touch sensor 20 has been illustrated as including the first electrode and the second electrode 22 that constitute the drive electrode and the detection electrode of the capacitive touch sensor, the touch sensor 20 may further include, in addition to these electrodes, an electrode for realizing a pressure-sensing function.

Although, in the embodiments, the organic EL display device has been illustrated as an example of the disclosure, other application examples include all flat-panel type display devices such as a liquid crystal display device, other self-luminous type display devices, and an electronic paper type display device including an electrophoretic element. Moreover, it is needless to say that the display device is applicable, without particular limitation, to from middle- and small-sized display devices to a large-sized display device.

Various altered and modified examples within the range of the idea of the invention will occur to those skilled in the art, and it should be understood that the altered and modified examples also belong to the scope of the invention. For example, when those skilled in the art appropriately add or remove a component or change the design of a component in the embodiments described above, or add or omit a step or change the conditions of a step in the embodiments described above, those are included in the scope of the invention as long as they include the spirit of the invention.

Moreover, it should be understood that, as to other operational effects achieved by the aspects described in the embodiments, an operational effect that is apparent from the description of the specification or will appropriately occur to those skilled in the art is of course achieved by the invention.

What is claimed is:

1. A display device with touch sensor comprising:
    a display region provided with a plurality of pixels including a light-emitting element;
    one or a plurality of organic insulating films formed of an organic insulating material, the organic insulating films being formed with a dividing groove by which each of the organic insulating films is divided outside the display region;
    a sealing film covering the light-emitting element, the organic insulating films, and the dividing groove and formed of an inorganic insulating material;
    a plurality of first electrodes arranged in the display region on the sealing film, in which the first electrodes that are adjacent in a first direction are connected via a first connection line and the first electrodes that are adjacent in a second direction intersecting with the first direction are not connected;

a plurality of second electrodes arranged in the same layer as, or in a layer different from, the first electrode and each surrounded by the first electrodes in a plan view, in which the second electrodes that are adjacent in the second direction are connected via a second connection line intersecting with the first connection line in a plan view and the second electrodes that are adjacent in the first direction are not connected;

an interlayer insulating film intervening between the first connection line and the second connection line and filling the dividing groove covered by the sealing film; and a lead wiring line connected to the first electrode or the second electrode and passing over a portion of the interlayer insulating film that fills the dividing groove.

2. The display device according to claim 1, wherein the interlayer insulating film is a film in which a portion intervening between the first connection line and the second connection line and the portion filling the dividing groove are continuously formed.

3. The display device according to claim 1, wherein the interlayer insulating film is a film in which a portion intervening between the first connection line and the second connection line and the portion filling the dividing groove are separately formed.

4. The display device according to claim 1, wherein the organic insulating films include an under insulating film formed below a pixel electrode disposed in the display region, and covering the display region and a peripheral region outside the display region.

5. The display device according to claim 1, wherein the organic insulating films include a pixel separation film formed on a pixel electrode disposed in the display region, and formed with an opening with the pixel electrode as its bottom.

6. The display device according to claim 1, further comprising a pixel separation film formed on a pixel electrode disposed in the display region, and formed with an opening with the pixel electrode as its bottom, wherein
an outer edge of the pixel separation film is located on the inner side than the dividing groove.

7. The display device according to claim 1, wherein
a film located in a layer below the sealing film and straddling a region formed with the dividing groove does not include an organic material.

8. The display device according to claim 1, wherein
the lead wiring line extends on and from the sealing film to the outside of the sealing film to straddle an outer edge of the sealing film.

9. The display device according to claim 1, wherein
the lead wiring line is connected to a first terminal provided in a peripheral region outside the display region.

10. The display device according to claim 9, further comprising a flexible printed circuit board connected to a second terminal provided in the peripheral region and electrically connected with the first terminal.

11. The display device according to claim 10, wherein
the flexible printed circuit board is also connected to a third terminal provided in the peripheral region and electrically connected to a pixel electrode disposed in the display region.

* * * * *